United States Patent
Tsai et al.

(10) Patent No.: US 8,283,683 B2
(45) Date of Patent: Oct. 9, 2012

(54) CHIP-BONDING LIGHT EMITTING DIODE CHIP

(75) Inventors: Chang-Da Tsai, Hsinchu (TW);
Wei-Che Wu, Hsinchu (TW);
Chia-Liang Hsu, Hsinchu (TW);
Ching-Shih Ma, Hsinchu (TW)

(73) Assignee: Opto Tech Corporation, Hsinchu (TW)

( * ) Notice: Subject to any disclaimer, the term of this patent is extended or adjusted under 35 U.S.C. 154(b) by 0 days.

(21) Appl. No.: 12/629,030

(22) Filed: Dec. 1, 2009

(65) Prior Publication Data

US 2010/0072497 A1    Mar. 25, 2010

Related U.S. Application Data

(63) Continuation-in-part of application No. 11/749,139, filed on May 15, 2007, now abandoned.

(30) Foreign Application Priority Data

Nov. 7, 2006  (TW) .............................. 95141205 A

(51) Int. Cl.
*H01L 33/00*       (2010.01)
(52) U.S. Cl. .................... 257/95; 257/99; 257/E23.023; 257/E33.056
(58) Field of Classification Search .................... 257/13, 257/79, 95–100, E33.023, E33.056
See application file for complete search history.

(56) References Cited

U.S. PATENT DOCUMENTS

| | | | |
|---|---|---|---|
| 5,502,316 A | 3/1996 | Kish et al. | |
| 6,221,683 B1 | 4/2001 | Nirschl et al. | |
| 6,258,699 B1 | 7/2001 | Chang et al. | |
| 6,559,379 B2 | 5/2003 | Solanki et al. | |
| 6,653,661 B2 | 11/2003 | Okazaki | |
| 6,687,268 B2 * | 2/2004 | Kitamura et al. | 372/22 |
| 6,967,117 B2 | 11/2005 | Horng et al. | |
| 7,253,735 B2 * | 8/2007 | Gengel et al. | 340/572.7 |
| 7,256,483 B2 | 8/2007 | Epler et al. | |
| 2002/0063256 A1 | 5/2002 | Lin | |
| 2002/0121644 A1 * | 9/2002 | Ueda | 257/99 |
| 2004/0036081 A1 * | 2/2004 | Okazaki | 257/99 |
| 2005/0142677 A1 | 6/2005 | Kon et al. | |
| 2005/0194599 A1 | 9/2005 | Tanaka | |
| 2006/0001055 A1 | 1/2006 | Ueno et al. | |
| 2006/0006405 A1 | 1/2006 | Mazzochette | |
| 2006/0043407 A1 * | 3/2006 | Okazaki | 257/100 |
| 2006/0057752 A1 * | 3/2006 | Yang | 438/26 |
| 2006/0091409 A1 * | 5/2006 | Epler et al. | 257/95 |
| 2006/0240585 A1 | 10/2006 | Epler et al. | |
| 2007/0152309 A1 | 7/2007 | Cheng | |

FOREIGN PATENT DOCUMENTS

JP    53-139990    12/1978
(Continued)

OTHER PUBLICATIONS

Japan Office Action issued on Sep. 20, 2011.

*Primary Examiner* — Kimberly Rizkallah
*Assistant Examiner* — Duy T Nguyen
(74) *Attorney, Agent, or Firm* — WPAT, PC; Justin King

(57) ABSTRACT

A light emitting diode chip includes a permanent substrate having a holding space formed on the permanent substrate; an insulating layer and a metal layer sequentially formed on the permanent substrate and the holding spacer; a die having a eutectic layer and a light-emitting region and bonded to the metal layer within the holding space via the eutectic layer coupling to the metal layer; a filler structure filled between the holding space and the die; and an electrode formed on the die and in contact with the light-emitting region.

10 Claims, 19 Drawing Sheets

FOREIGN PATENT DOCUMENTS

| | | |
|---|---|---|
| JP | 55-070080 | 5/1980 |
| JP | 04-211182 | 3/1992 |
| JP | 10-098215 | 4/1998 |
| JP | 2005-050871 | 2/2005 |
| JP | 2005044849 | 2/2005 |
| JP | 2005-129799 | 5/2005 |
| JP | 2005277280 | 10/2005 |
| JP | 2006128710 | 5/2006 |
| TW | 369731 | 9/1999 |
| WO | 2005008793 | 1/2005 |

* cited by examiner

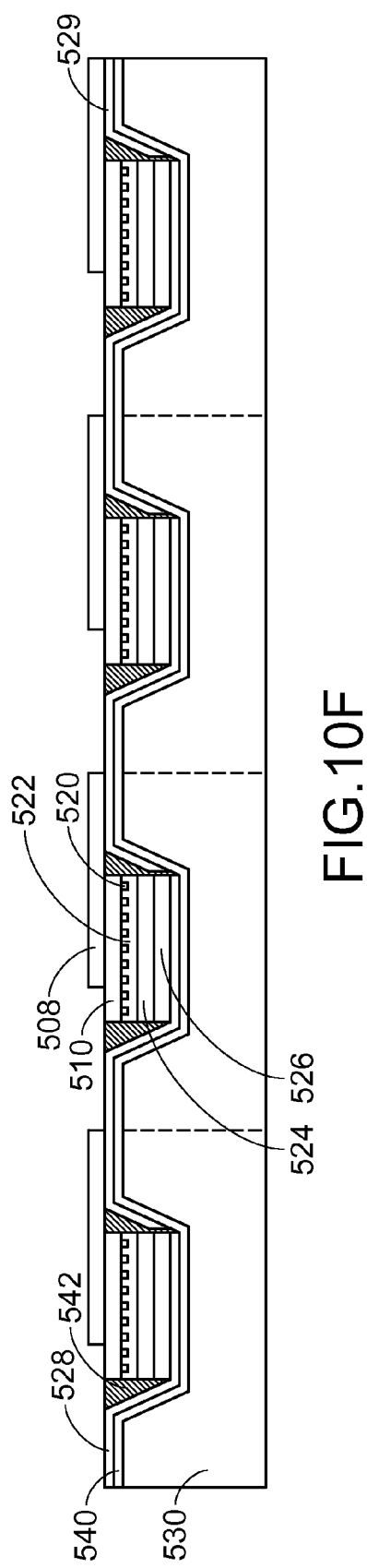
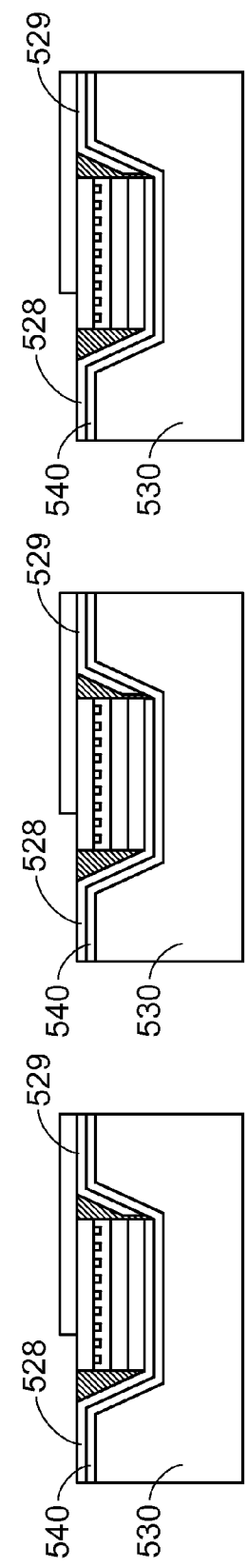

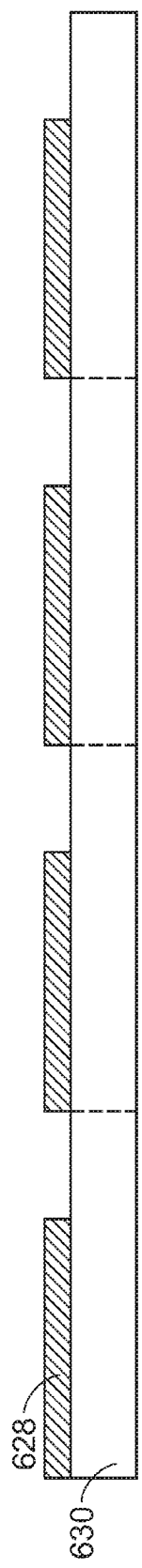
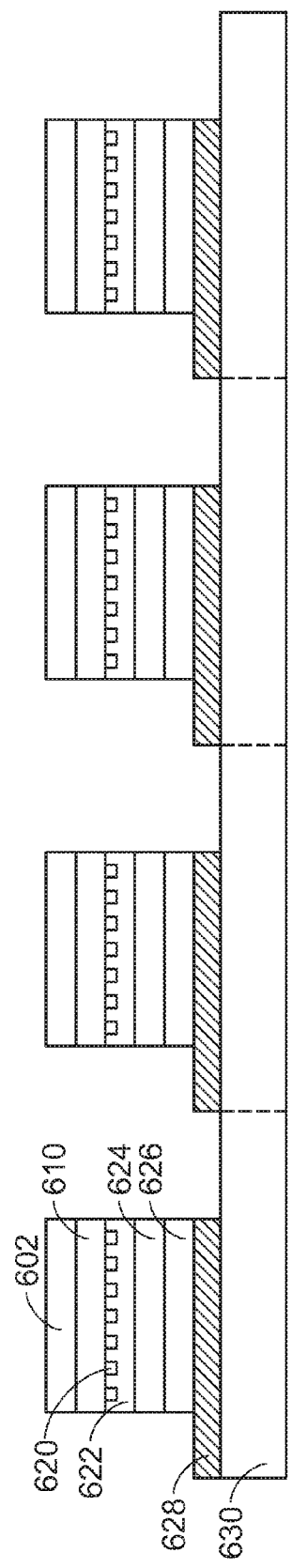

US 8,283,683 B2

CHIP-BONDING LIGHT EMITTING DIODE CHIP

CROSS REFERENCE TO RELATED PATENT APPLICATION

This patent application is a continuation in part of application of U.S. patent application Ser. No. 11/749,139 filed May 15, 2007 now abandoned, which claims the foreign priority of Taiwanese patent application No. 095141205 filed on Nov. 7, 2006.

FIELD OF THE INVENTION

The present invention relates to a light emitting diode (LED) chip, and more particularly to a chip-bonding LED chip.

BACKGROUND OF THE INVENTION

LEDs are employed in a wide variety of applications. For example, in optical data transmission, LEDs are used to launch data signal alone a fiber-optic cable.

FIG. 1 depicts a prior-art AlGaInP quaternary LED chip. In the AlGaInP quaternary LED chip 100, a light-emitting region 110 is grown on the surface of an n-doped GaAs substrate 102. The light-emitting region 110 includes an n-doped AlGaInP layer 103, an AlGaInP active layer 104, a p-doped AlGaInP layer 105, and a p-doped GaP layer 106 arranged in the listed order. Moreover, a first electrode 108 is formed on the surface of the p-doped GaP layer 106 and a second electrode 109 is formed on the surface of the n-doped GaAs substrate 102. Typically, the AlGaInP active layer 104 is a double-heterostructure active layer or a quantum-well active layer.

Because the energy gap of the GaAs substrate 102 is less than the emission energy of the AlGaInP active layer 104, the GaAs substrate 102 will absorb some of the light generated within the AlGaInP active layer 104, thereby reducing the efficiency of the LED chip 100.

Improved performance can be achieved by employing an optically-transparent substrate instead of the n-doped GaAs substrate. The method is disclosed by the U.S. Pat. No. 5,502,316. Firstly, the removal of the n-doped GaAs substrate 102 is prior to the formation of the electrodes. Next, an optically-transparent substrate 122 (e.g., n-doped GaP substrate, glass substrate, or quartz substrate) is bonded to the light-emitting region 110 at a relatively high temperature (e.g., 800~1000° C.) utilizing a wafer-bonding technique. FIG. 2 depicts a LED chip 120 having an optically-transparent substrate 122 (e.g., n-doped GaP substrate), and the optically-transparent substrate 122 is electrically conductive. In the LED chip 120, the first electrode 108 is formed on the surface of the p-doped GaP layer 106 and a second electrode 111 is formed partially on the surface of the n-doped GaP substrate 122. Because the light generated in the AlGaInP active layer 104 can travel through the optically-transparent substrate 122, thereby enhancing the performance of the LED chip 120.

FIGS. 3A to 3F depict the steps of manufacturing a LED chip utilizing the prior-art wafer-bonding technique. In FIG. 3A, a single large-size substrate 102 is provided for the EPI process, wherein the substrate 102 is an n-doped GaAs substrate, also referred as a temporary substrate. In FIG. 3B, a light-emitting region 110 is formed on the surface of the substrate 102. In FIG. 3C, the temporary substrate 102 is removed and only the light-emitting region 110 is left. In FIG. 3D, a large-size permanent substrate 122 (e.g., optically-transparent substrate) is provided and wafer bonded to the light-emitting region 110 at a relatively high temperature. In FIG. 3E, a plurality of first electrodes 108 and a plurality of second electrodes 111 are formed on the surface of the light-emitting region 110 and the surface of the permanent substrate 122, respectively. At last, as depicted in FIG. 3F, a plurality of LED chips are obtained after cutting the structure of FIG. 3E.

It is well understood that semiconductor material easily degrades at a relatively high temperature. Unfortunately, the wafer-bonding technique should be processed at a relatively high temperature, and the relatively high temperature may degrade the light-emitting region 110. Moreover, because the sizes of the light-emitting region 110 and the permanent substrate 122 are relatively large, any uneven or particles adhered to the surfaces of the light-emitting region 110 or the permanent substrate 122 may cause failure in the wafer-bonding step. Moreover, because the wafer-bonding step is performed after the removal of the temporary substrate 102, the light-emitting region 110 would be unsupported by a substrate and will be difficult to handle without breaking.

Another method for fixing the light-absorbing problem in the substrate is disclosed by the U.S. Pat. No. 6,967,117 which adopts a reflecting layer for reflecting the light out the substrate. As depicted in FIG. 4A, a light-emitting region 110 is formed on the surface of a temporary substrate 102 (e.g., n-doped GaAs substrate), and the light-emitting region 110 sequentially includes an n-doped AlGaInP layer 103, an AlGaInP active layer 104, a p-doped AlGaInP layer 105, and a p-doped GaP layer 106. In addition, a buffer layer 145 and a reflecting layer 144 are sequentially formed on the surface of the light-emitting region 110. In FIG. 4B, a permanent substrate 142 is provided and a diffusion barrier layer 143 is formed on the surface of the permanent substrate 142. In FIG. 4C, the reflecting layer 144 is wafer bonded to the diffusion barrier layer 143 at a relatively high temperature, and then, a first electrode 112 is formed on the surface of the n-doped AlGaInP layer 103 and a second electrode 113 is formed on the surface of the permanent substrate 142 after the removal of the temporary substrate 102. Because the light upwardly toward the permanent substrate 142 will be reflected by the reflecting layer 144, thereby the performance of the LED chip is enhanced.

FIGS. 5A to 5G depict the steps of manufacturing a LED chip utilizing the wafer-bonding technique disclosed in the U.S. Pat. No. 6,967,117. In FIG. 5A, a single large-size substrate 102 is provided for the EPI process, wherein the substrate 102 is an n-doped GaAs substrate, also referred as a temporary substrate. In FIG. 5B, a light-emitting region 110 is formed on the surface of the substrate 102, and then a buffer layer 145 and a reflecting layer 144 are sequentially formed on the surface of the light-emitting region 110. In FIG. 5C, a permanent substrate 142 is provided and a diffusion barrier layer 143 is formed on the surface of the permanent substrate 142. In FIG. 5D, the diffusion barrier layer 143 is wafer bonded to the reflecting layer 144 at a relatively high temperature. In FIG. 5E, the substrate 102 is removed from the structure of FIG. 5D. In FIG. 5F, a plurality of first electrodes 112 are formed on the surface of the light-emitting region 110 and a second electrode 113 is formed on the surface of the permanent substrate 142. At last, as depicted in FIG. 5G, a plurality of LED chips are obtained after cutting the structure of FIG. 5F.

Alternatively, after the step depicted in FIG. 5E is completed, an etching procedure can be processed to partially remove the light-emitting region 110. A first electrode 112 and a second electrode 113 are respectively formed on the surface of the n-doped AlGaInP layer 103 and the portion of the p-doped GaP layer 106, and this structure is then cut into a plurality of planar-electrode LED chips as shown in FIG. 6.

In the above-described method, the wafer-bonding step is processed prior to the removal of the temporary substrate and the formation of the electrodes. However, even the problem encountered in the U.S. Pat. No. 5,502,316, a weak mechanical strength due to the removal of the temporary substrate, can be avoided in this method, a low reflectivity, so as reducing the efficiency of the LED still occurs due to an alloy procedure during the formation of the first and the second electrodes on the bonded chips. Moreover, the etching procedure processed to the light-emitting region 110 will reduce the surface area of the light-emitting region 110 depicted in FIG. 6, and current cannot uniformly travel through the light-emitting region 110, so as the efficiency of the LED is reduced.

The U.S. Pat. No. 6,221,683 discloses another method of manufacturing a LED chip. As depicted in FIG. 7A, a light-emitting region 110 is formed on the surface of a temporary substrate (e.g., n-doped GaAs), and the light-emitting region 110 sequentially includes an n-doped AlGaInP layer 103, an AlGaInP active layer 104, a p-doped AlGaInP layer 105, and a p-doped GaP layer 106. Next, first metallic contacts 162 are formed on the surface of the n-doped AlGaInP layer 103 of the light-emitting region 110 after the removal of the temporary substrate. In FIG. 7B, a permanent substrate 166 is provided and on which second metallic contacts 164 are formed. In FIG. 7C, a solder layer 163 is provided between the first metallic contacts 162 and the second metallic contacts 164, and the first metallic contacts 162 are wafer bonded to the second metallic contacts 164. Then, a first electrode 170 is formed on the surface of the p-doped GaP layer 106 and a second electrode 172 is formed on the surface of the permanent substrate 166, wherein the formation of the first electrode 170 and the second electrode 172 may be performed before the wafer-bonding step.

FIGS. 8A to 8G depict the steps of manufacturing a LED chip utilizing the wafer-bonding technique disclosed in the U.S. Pat. No. 6,221,683. In FIG. 8A, a single large-size substrate 102 is provided for the EPI process, wherein the substrate 102 is an n-doped GaAs substrate, also referred as a temporary substrate. In FIG. 8B, a light-emitting region 110 is formed on the surface of the temporary substrate 102. In FIG. 8C, a plurality of first metallic contacts 162 are formed on the surface of the light-emitting region 110 after the removal of the temporary substrate 102. In FIG. 8D, a permanent substrate 166 is provided and a plurality of second metallic contacts 164 are formed on the surface of the permanent substrate 166. In FIG. 8E, a solder layer 163 is provided between the first metallic contacts 162 and the second metallic contacts 164, and the second metallic contacts 164 are wafer bonded to the first metallic contacts 162. In FIG. 8F, a plurality of first electrodes 170 are formed on the surface of the light-emitting region 110 and a second electrode 172 is formed on the surface of the permanent substrate 166. At last, FIG. 8G depicts that a plurality of LED chips are obtained after cutting the above-described structure in FIG. 8F.

Similarly, the above-mentioned problems, including that the light-emitting region 110 is difficult to handle without breaking after the removal of the temporary substrate and the efficiency of the LED degrades during the alloy procedure, still occur.

SUMMARY OF THE INVENTION

There, the present invention provides a chip-bonding LED chip having a permanent substrate, a portion of which supports a die including a light-emitting region. The chip-bonding LED chip has a better efficiency.

The present invention provides a LED chip, including: a permanent substrate having a holding space on top of the permanent substrate; an insulating layer on top of the permanent substrate and a metal layer on top of the insulating layer. The LED chip further includes a die, including a eutectic layer and a light-emitting region, bonded to the metal layer within the holding space via the eutectic layer coupling to the metal layer. A filler structure is filled between the die and the holding space. An electrode is formed on top of the die and in contact with the light-emitting region. The electrode further extends to outside of the holding space and is partially supported by the filler structure. The thickness of the light-emitting region is between 10 μm~30 μm.

Moreover, the present invention further provides another LED chip, including: a permanent substrate having a holding space on top of the permanent substrate; an insulating layer on top of the permanent substrate and a metal layer on top of the insulating layer. The LED chip further includes a die, including a eutectic layer and a light-emitting region, bonded to the metal layer within the holding space via the eutectic layer coupling to the metal layer. A filler structure is filled between the die and the holding space. An electrode is formed on top of the die and in contact with the light-emitting region. The electrode further extends to outside of the holding space. A portion of the surface of the light-emitting region of the LED chip is exposed from the filler structure and the electrode. After a package procedure, the exposed light-emitting region of the LED chip is well protected.

BRIEF DESCRIPTION OF THE DRAWINGS

The above contents of the present invention will become more readily apparent to those ordinarily skilled in the art after reviewing the following detailed description and accompanying drawings, in which:

FIGS. 10A to 10H show steps of manufacturing the LED chip of FIG. 9 utilizing a chip-bonding technique according to the first embodiment of the present invention.

FIGS. 13A to 13G show steps of manufacturing the LED of FIG. 11 utilizing the chip-bonding technique according to the second embodiment of the present invention.

DETAILED DESCRIPTION OF THE PREFERRED EMBODIMENT

Figure 1:
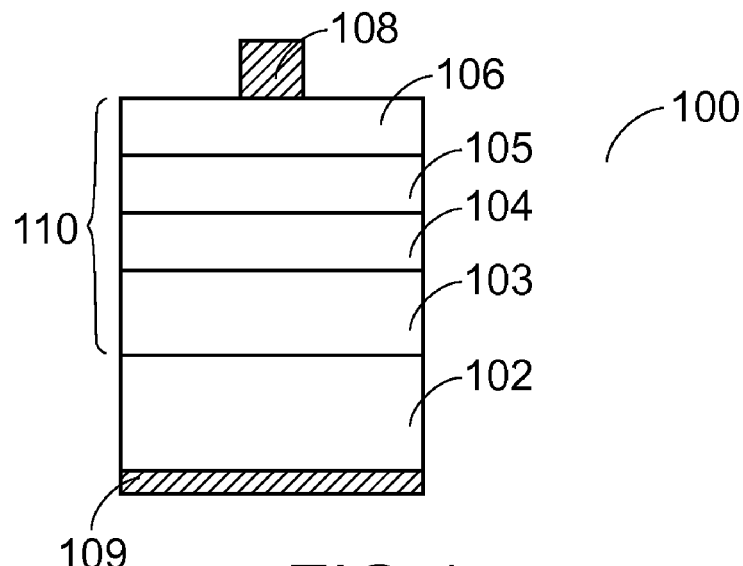
FIG. 1 is a cross-sectional diagram of an AlGaInP quaternary LED in the prior art.
Figure 2:
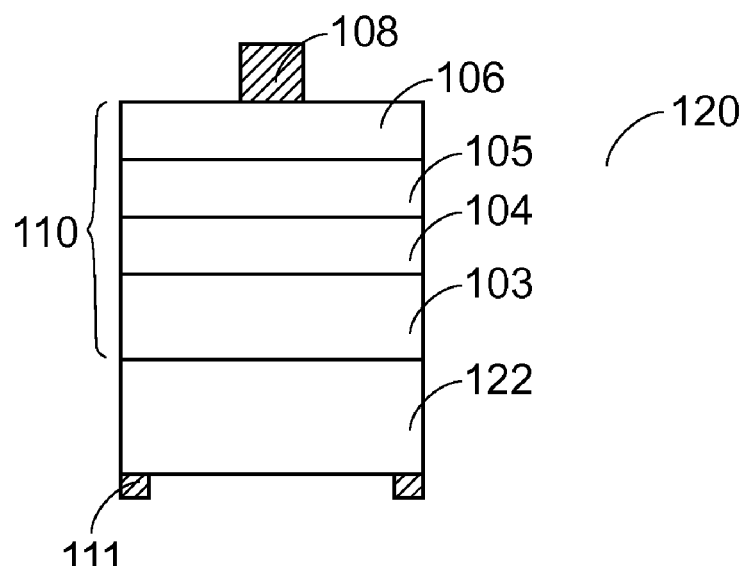
FIG. 2 is a cross-sectional diagram of another AlGaInP quaternary LED in the prior art.
Figure 3A:
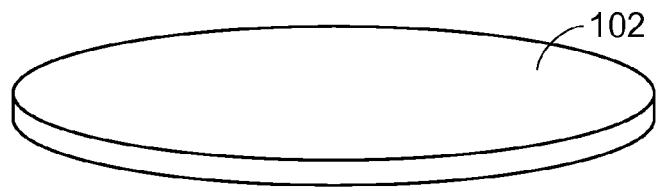
FIGS. 3A to 3F show the steps of manufacturing the LED chip of FIG. 2 utilizing a wafer-bonding technique in the prior art.
Figure 3B:
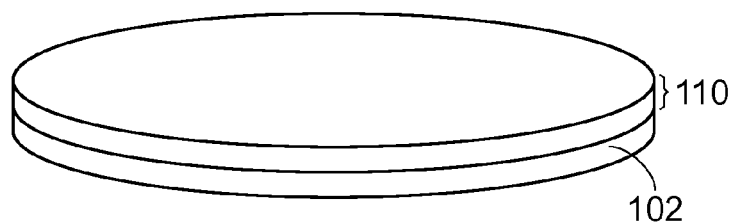
Figure 3C:
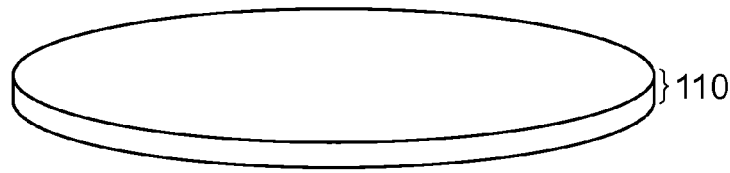
Figure 3D:
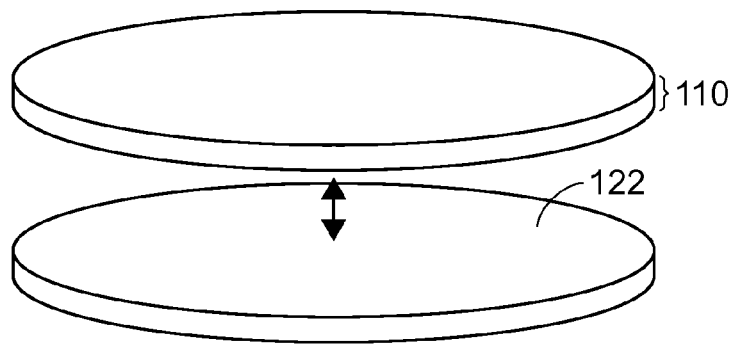
Figure 3E:
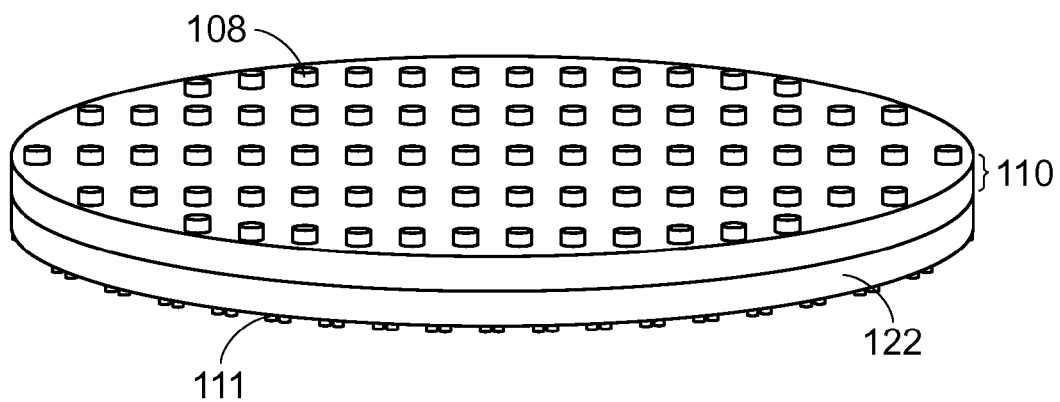
Figure 3F:
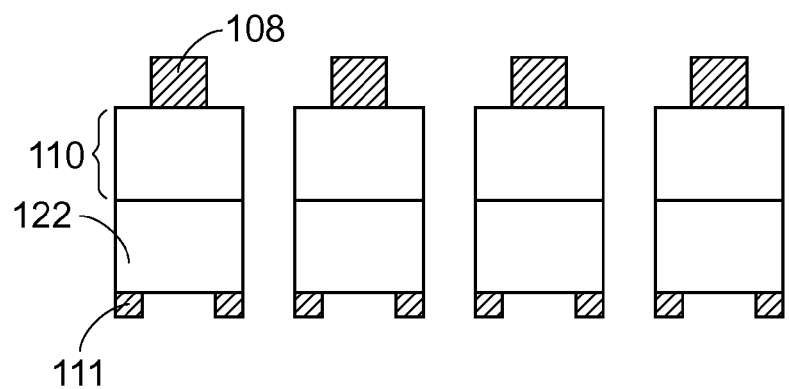
Figure 4A:
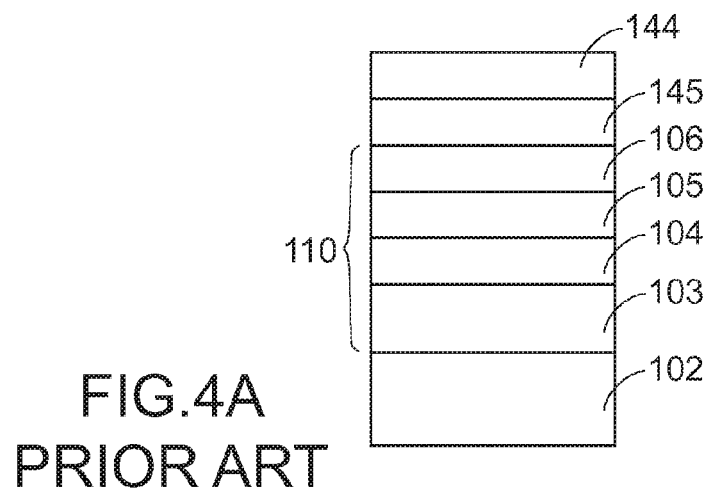
FIGS. 4A to 4C show the process of manufacturing a LED chip having a reflecting layer in the prior art.
Figure 4B:
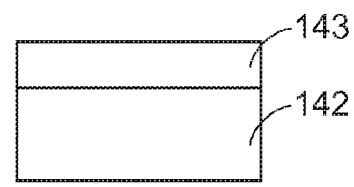
Figure 4C:
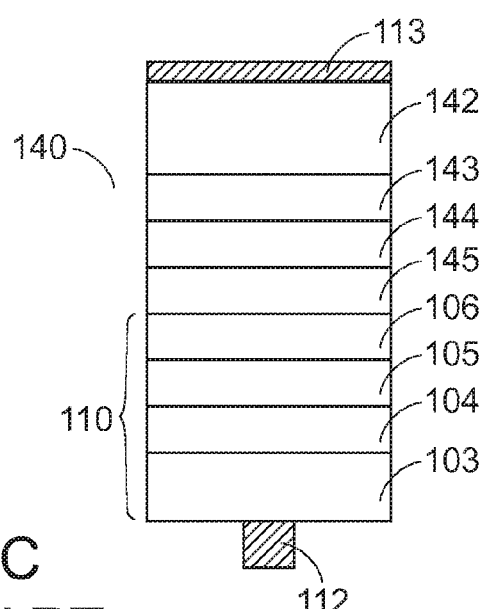
Figure 5A:
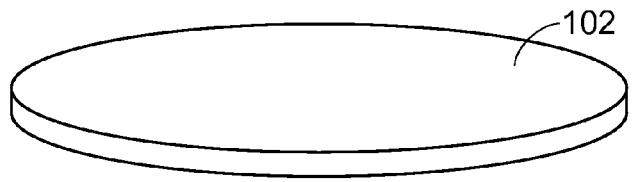
FIGS. 5A to 5G show steps of manufacturing the LED chip of FIG. 4 utilizing the wafer-bonding technique.
Figure 5B:
Figure 5C:
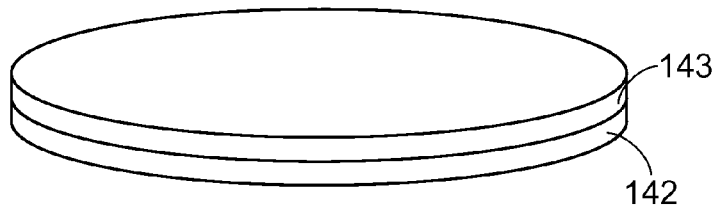
Figure 5D:
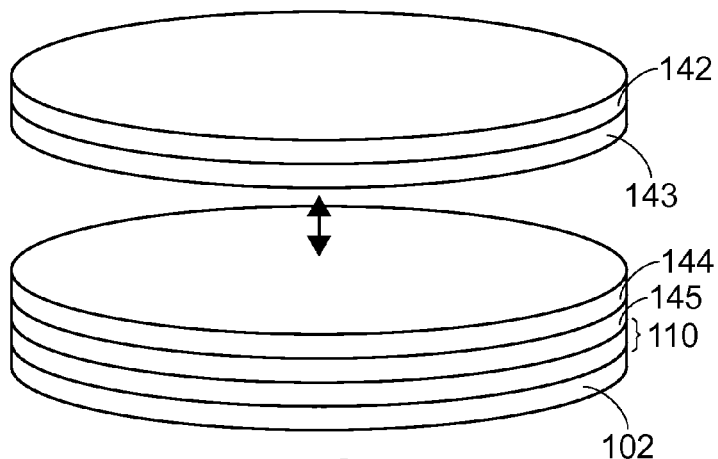
Figure 5E:
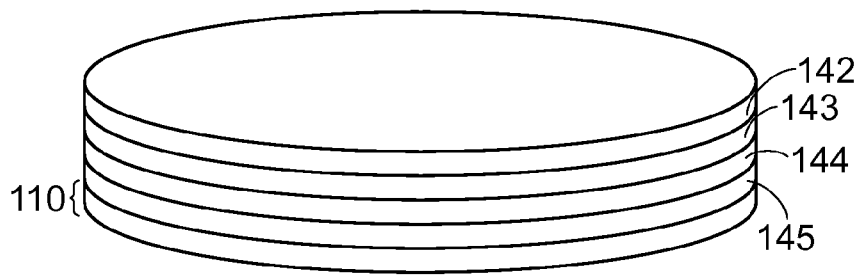
Figure 5F:
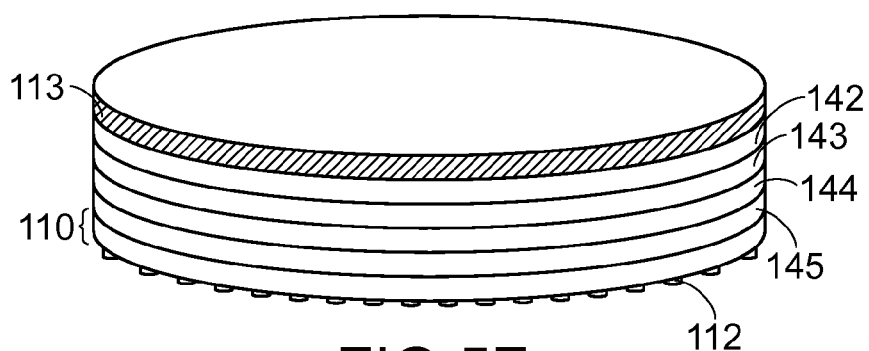
Figure 5G:
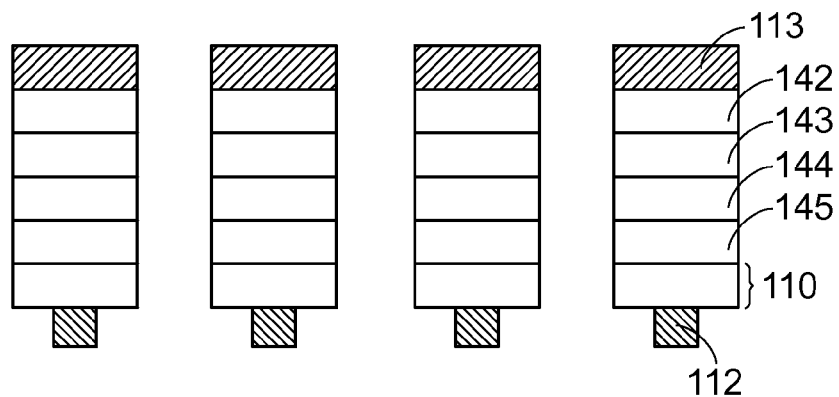
Figure 6:
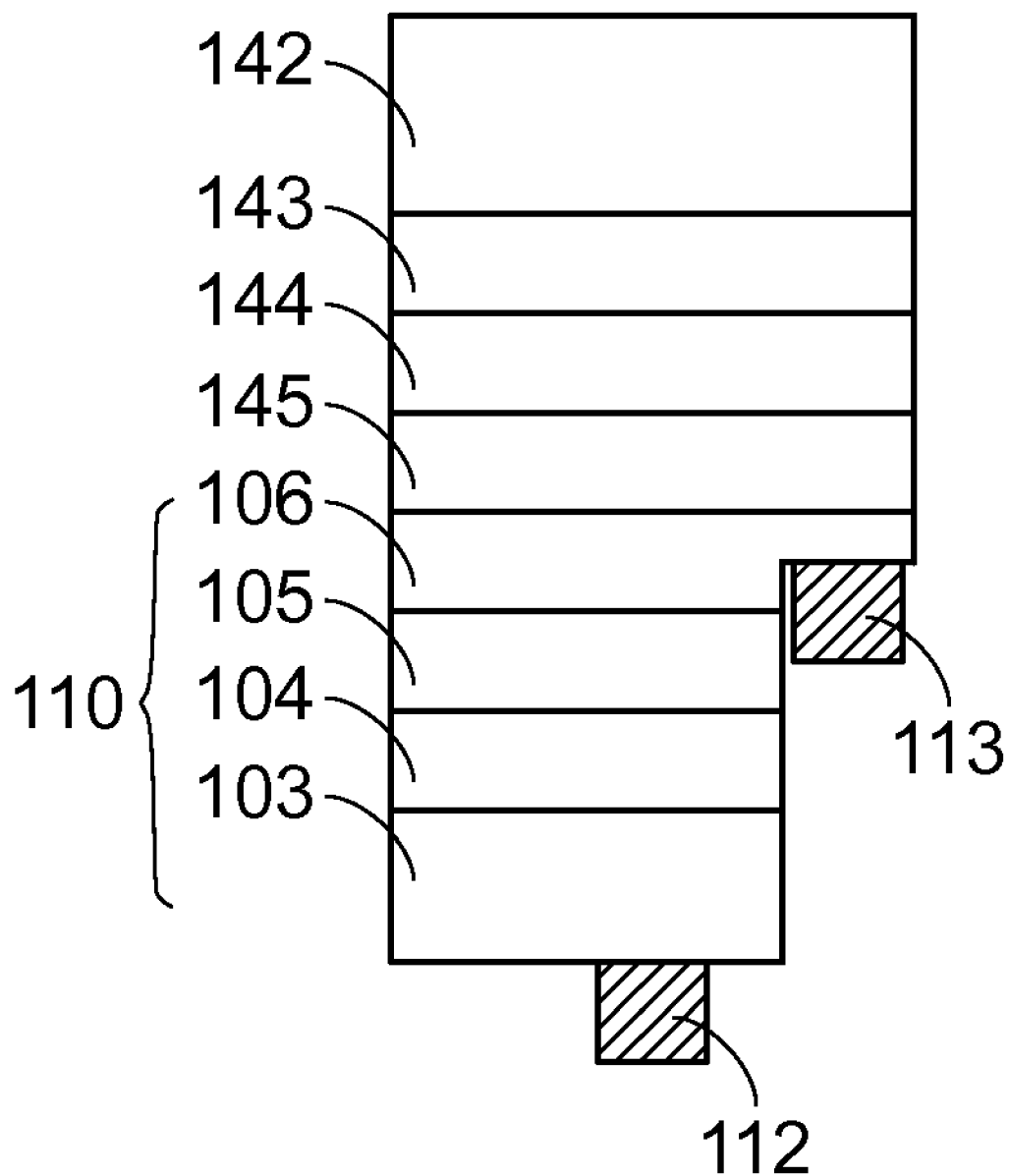
FIG. 6 is a cross-sectional diagram of another LED chip having a reflecting layer in the prior art.
Figure 7A:
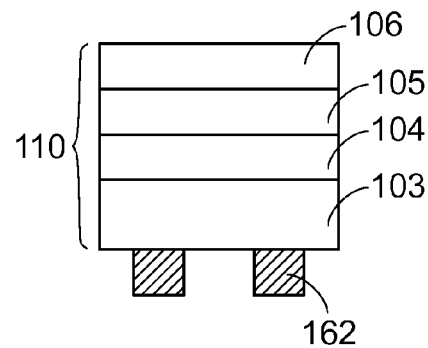
FIGS. 7A to 7C show the process of manufacturing a LED chip having a solder layer in the prior art.
Figure 7B:
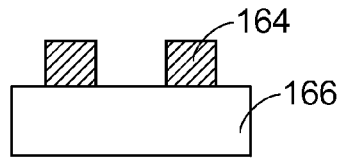
Figure 7C:
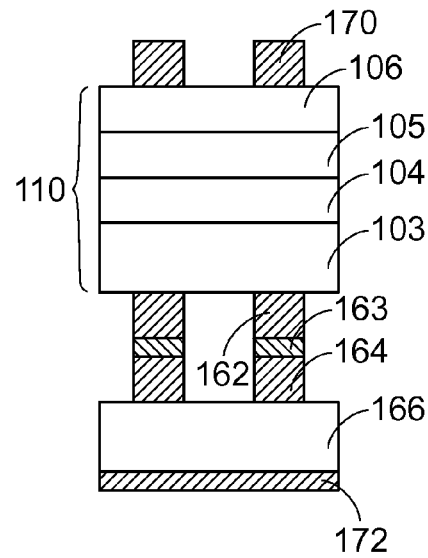
Figure 8A:
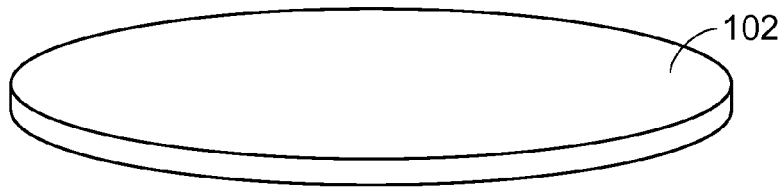
FIGS. 8A to 8G show the steps of manufacturing the LED chip of FIG. 7 utilizing the wafer-bonding technique.
Figure 8B:
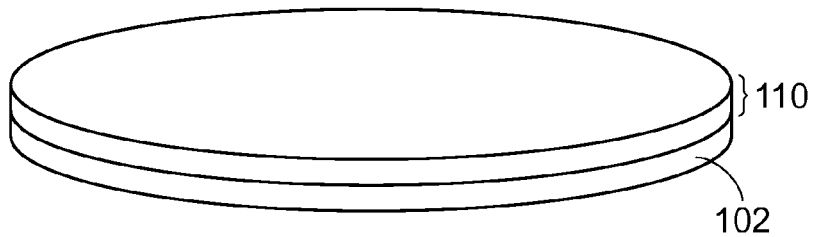
Figure 8C:
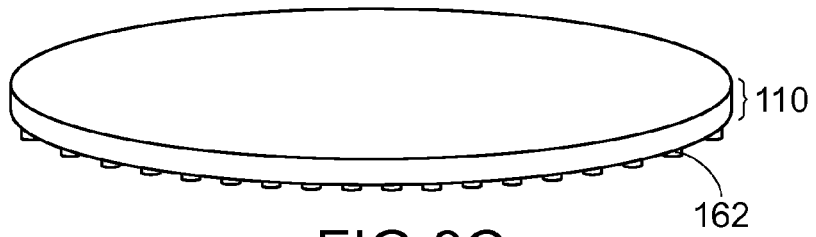
Figure 8D:
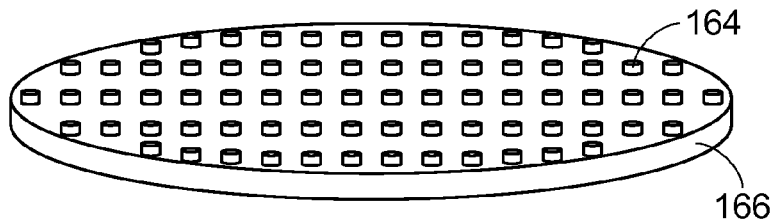
Figure 8E:
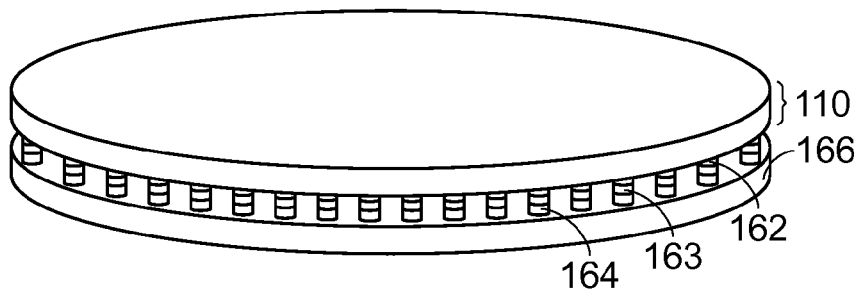
Figure 8F:
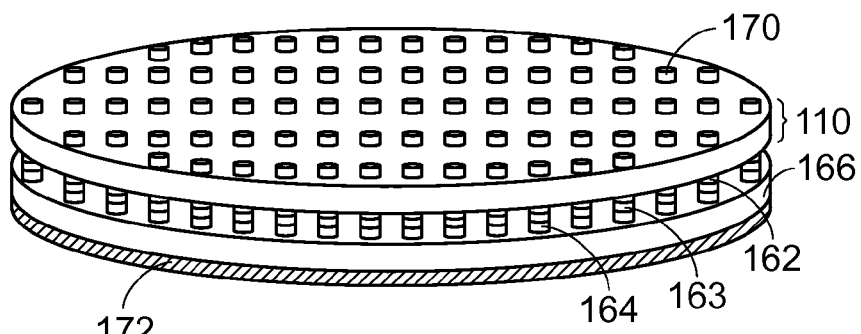
Figure 8G:
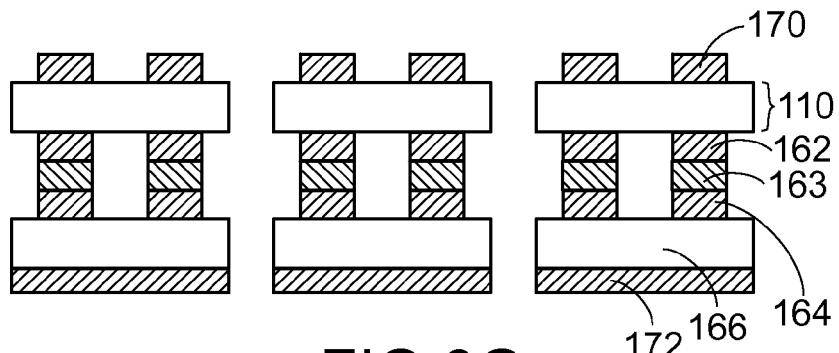
Figure 9:
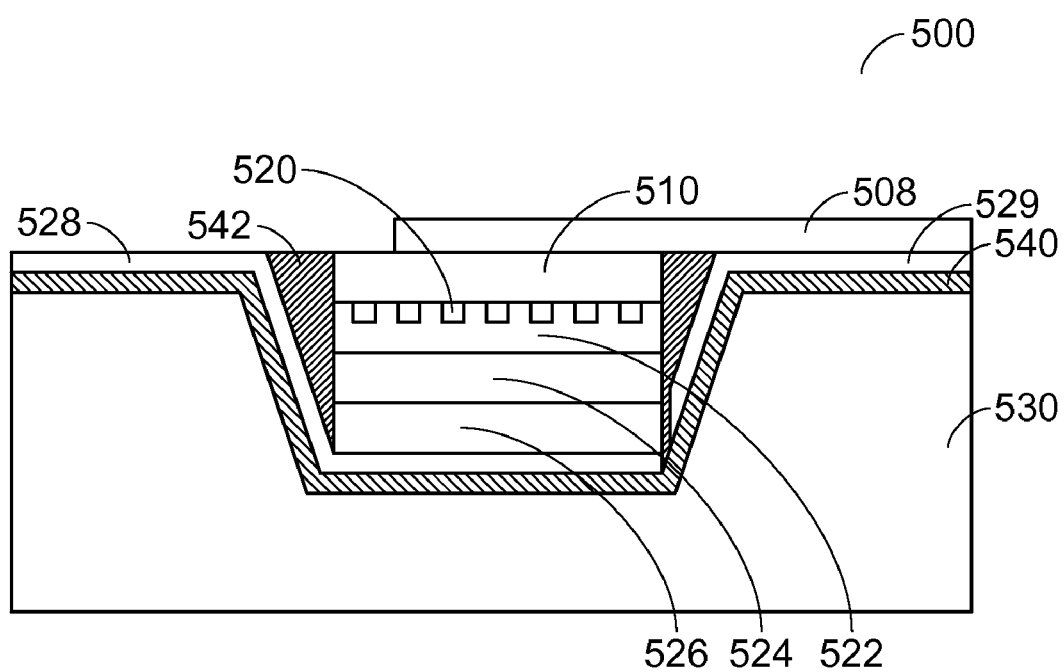
FIG. 9 is a cross-sectional diagram showing a chip-bonding LED chip according to the first embodiment of the present invention.

The present invention discloses a chip-bonding LED chip for fixing the defects of the conventional LED chip that is manufactured by the wafer-bonding technique. FIG. 9 is a cross-sectional diagram showing the structure of the chip-bonding LED chip of the first embodiment of the present invention. The chip-bonding LED chip 500 includes a first electrode 508, a light-emitting region 510, a plurality of ohmic contact dots 520, a reflecting layer 522, a barrier layer 524, a eutectic layer 526, a filler structure 542, a first metal layer 528, a second metal layer 529, an insulating layer 540, and a permanent substrate 530 having a holding space. The first metal layer 528 is served as a second electrode. The filler structure 524 is made of polyimide, and the filler structure 524 is filled into the holding space after the chip bonding step.

In the first embodiment of the present invention, a large-size Si substrate 530 is provided and served as the permanent substrate, and then the holding space is formed on the surface of the permanent substrate 530 after an etching procedure is processed to the permanent substrate 530. After the die is loaded in the holding space, the die is alloyed to the holding space. After the alloy procedure is processed, the temporary substrate is then removed and the electrode is formed, so as the chip-bonding LED chip of the first embodiment of the present invention is manufactured.

Figure 10A:
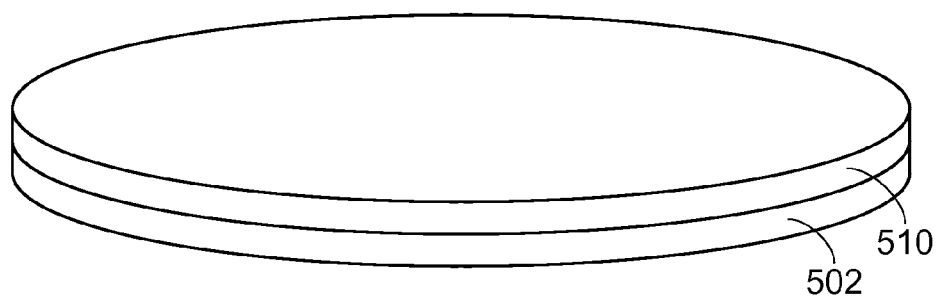

FIGS. 10A to 10G depict the steps of manufacturing the chip-bonding LED chip in the first embodiment of the present invention. In FIG. 10A, an n-doped GaAs temporary substrate 502 is provided and on which a light-emitting region 510 is formed. The light-emitting region 510 at least includes an n-doped AlGaInP layer, an AlGaInP active layer, a p-doped AlGaInP layer, and a p-doped GaP layer arranged in the listed order. Typically, the AlGaInP active layer is a double-heterostructure active layer or a quantum-well active layer. It is understood that the structure of the light-emitting region 510 may vary in configurations according to different requirements. It is intended not to limit the structure of the light-emitting region 510 in the first embodiment of the present invention.

Figure 10B:
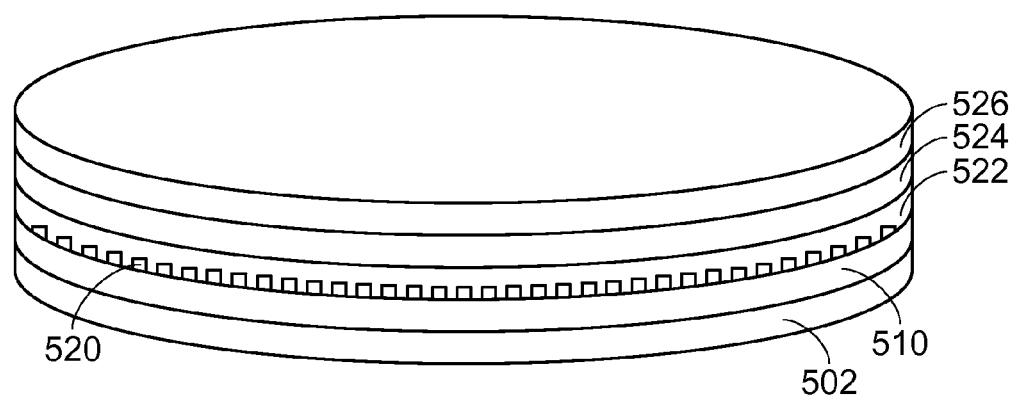

In FIG. 10B, a plurality of ohmic contact dots 520, a reflecting layer 522, a barrier layer 524, and a eutectic layer 526 are sequentially formed on the surface of the light-emitting region 510. In the first embodiment of the present invention, the material of the ohmic contact dot 520 is Be/Au or Zn/Au alloy. The reflecting layer 522 is made of a metal having a high reflectivity (e.g., Au, Al or Ag), or a combination of ITO layer (Indium Tin Oxide) and a metal having a high reflectivity. The ITO layer can serve as a reflecting layer due to different refractive indexes of the ITO layer and the light-emitting material. Additionally, the ITO layer can also avoid an inter-diffusion between the metal layer and the light-emitting material, so as to keep the reflectivity of the metal layer. The barrier layer 524 is made of Au, Al, Ag, or ITO layer having a high stability and a high melting point. The eutectic layer 526 is made of Sn, Sn/Au, Sn/In, Au/In, or Sn/Ag alloy having a melting point around 300° C.

Figure 10C:
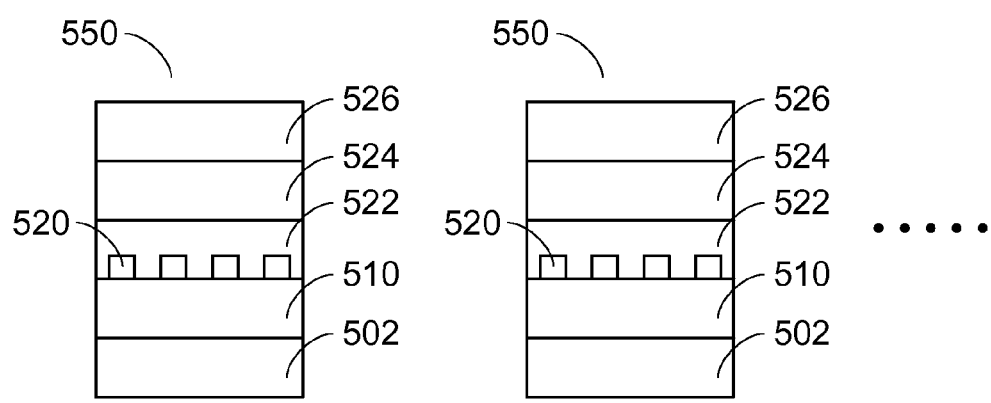

In FIG. 10C, a plurality of die 550 are manufactured after cutting the above-described structure of FIG. 10B, and each die 550 includes the temporary substrate 502, the light-emitting region 510, a plurality of ohmic contact dots 520, the reflecting layer 522, the barrier layer 524, and the eutectic layer 526.

Figure 10D:
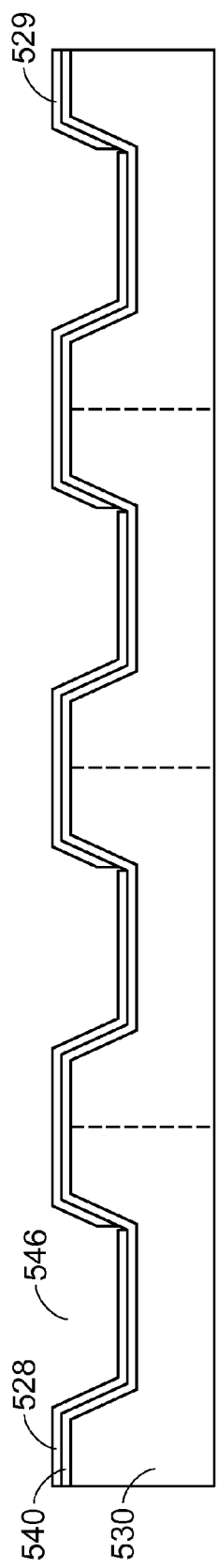

In FIG. 10D, a large-size Si permanent substrate 530 is provided, and a plurality of fillisters are formed after the etching procedure is processed on the surface of the permanent substrate 530, wherein the top area of the fillister is larger than the bottom area of the fillister. Next, an insulting layer 540, a first metal layer 528, and a second metal layer 529 are sequentially formed on the surface of the permanent substrate 530, so as the holding space 546 is formed. The first metal layer 528 and the second metal layer 529 are both formed on the insulting layer 540 but not in contact with each other. That means both the first metal layer 528 and the second metal layer 529 are contained on each individual permanent substrate 530 after the structure of the permanent substrate 530 is cut (dot line). As depicted in FIG. 10D, there is a gap between the first metal layer 528 and the second metal layer 529, and the gap is formed on one side of the bottom of the holding space 546.

Figure 10E:
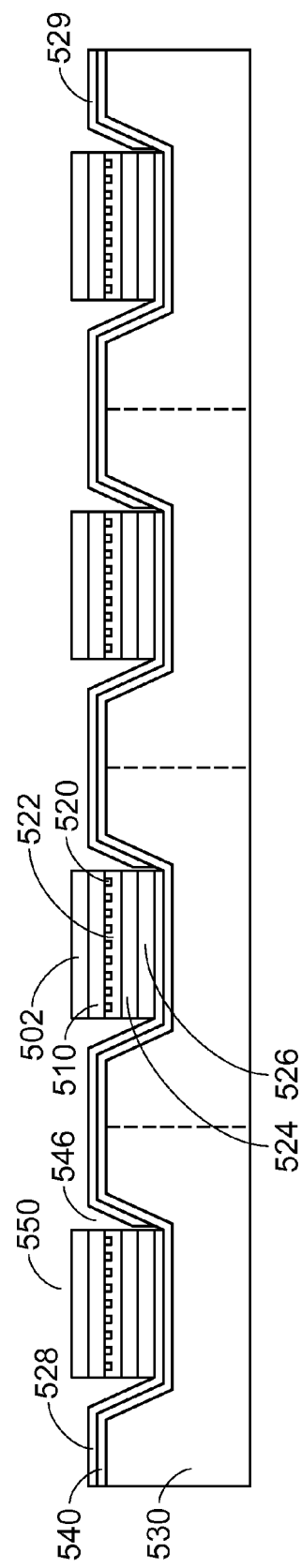

In FIG. 10E, each holding space 546 is loaded with a die 550, and the eutectic layer 526 of the die 550 is attached with the first metal layer 528. When all the dice 550 are loaded in the holding space 546, the alloy procedure is processed at a relatively low temperature (e.g., 300° C.), which means the eutectic layer 526 of the die 550 is alloyed to the first metal layer 528. In the first embodiment of the present invention, the bottom area of the holding space 546 is designed to equal, or greater, than the cross-sectional area of the die 550, so as the die 550 can slip and align to the bottom of the holding space 546 successfully because the top area of the holding space 546 is greater than the cross-sectional area of the die 550.

Figure 10H:
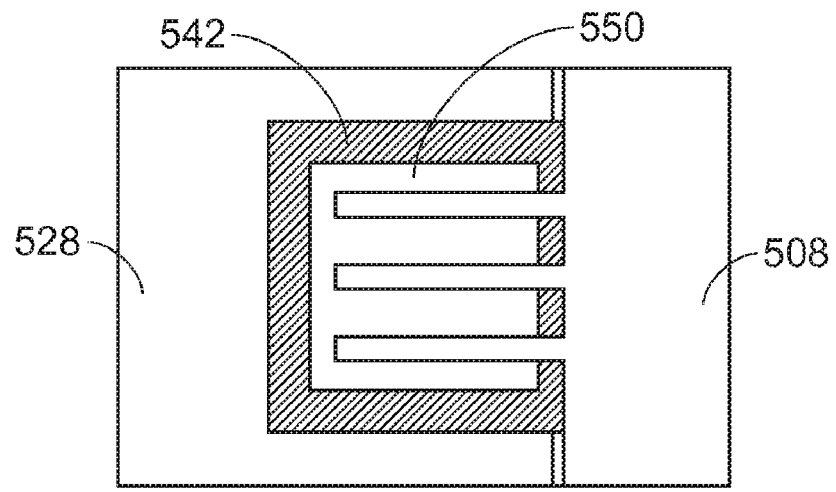

In FIG. 10F, the temporary substrate 502 is removed by a mechanical-polishing procedure or a chemical-etching procedure. A filler structure 542 is then formed by filling the gap between the die 550 and the holding space 546 with insulating filler material. Then the first electrode 508 is formed on the surface of the n-doped AlGaInP layer of the light-emitting layer 510. In the first embodiment, the first electrode 508 is in contact with the second metal layer 529, and the filler material is polyimide. The first electrode extends to outside of the holding space 546 and is partially supported by the filler structure In FIG. 10G, a plurality of chip-bonding LED chips are manufactured after cutting the permanent substrate 530 of the structure depicted in FIG. 10F. FIG. 10H is a top view of the chip-bonding LED chip.

In the first embodiment of the present invention, the first metal layer 528 serves as a second electrode because the first metal layer 528 is alloyed to the eutectic layer 526 of the die 550. Additionally, because the first electrode 508 is in contact with the second metal layer 529 and both the first metal layer 528 (second electrode) and the first electrode 508 are not entirely covered with the filler material, the bonding wires can be directly bonded to the first metal layer 528 (second electrode) and the first electrode 508 without damaging the chip. Moreover, the first metal layer 528 and the second metal layer 529 can also function for reflecting the light, generated by the light-emitting region 510, out the LED chip, so as the performance of the LED chip is enhanced.

In the first embodiment of the present invention, the alloy procedure is processed prior to the removal of the temporary substrate 502, so as the light-emitting region 510 in chip can be relatively thin (e.g., 10 μm~30 μm), and the cost of the EPI process can be down. Moreover, the wafer broken occurring in the alloy procedure can be avoided because the wafer is cut into dice 550 first, and then placed in the holding space 546, so as the yield of the LED chips is almost 100%. In addition, the alloy procedure between the die 550 and the substrate 530 of the first embodiment of the present invention can be processed at a relatively low temperature without degrading the performance of the chips. The alloy temperature is under temperature 300° C. if the eutectic layer is made of Sn/Au having ratio of 20/80 (Sn20Au80).

Figure 11A:
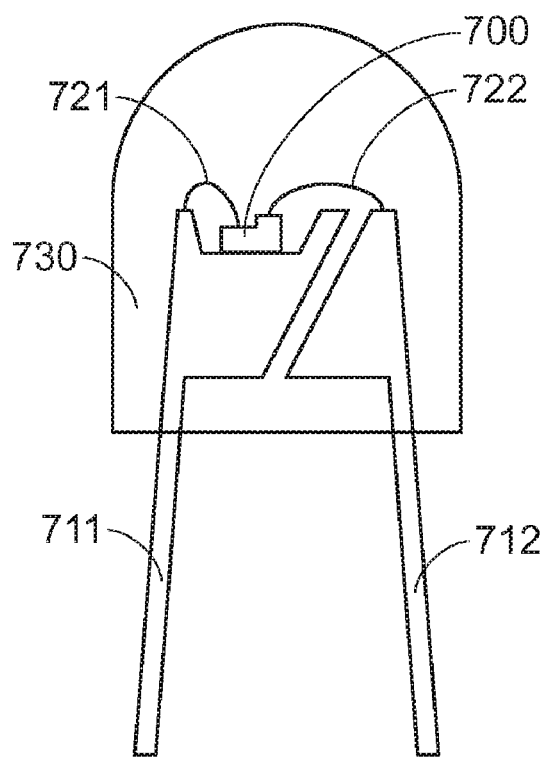
FIGS. 11A and 11B are schematic diagrams showing package structures of the LED chip of FIG. 9.

As shown in FIG. 10H, a portion of the surface of the light-emitting region 510 of the LED chip is covered by the first electrode 508 while the other portion of the surface is exposed to the atmosphere. The exposed portion of the light-emitting region may be damaged due to improper contact, oxidation, or moisture. Hence, the manufactured LED chip should be packaged to prevent from such damage affecting the emitting efficiency. There are several types of package structures commonly used for LED chip. Please refer to FIG. 11A, a schematic diagram showing a lamp-type LED device. The LED chip 700 of the present invention is placed on a leadframe including two conductive parts 711 and 712, in which one serves as an anode and the other serves as a cathode. The two electrodes of the LED chip 700 are wire-bonded to the two conductive parts 711 and 712 via wires 721 and 722, respectively. The LED chip 700, the wires 721 and 722, and the upper portion of the leadframe are wrapped in protective material, epoxy for example. The shape of the epoxy case 730 can adjust the light focusing or divergence of the LED device. Hence, the LED device with the package structure have the LED chip 700 well protected.

Figure 11B:
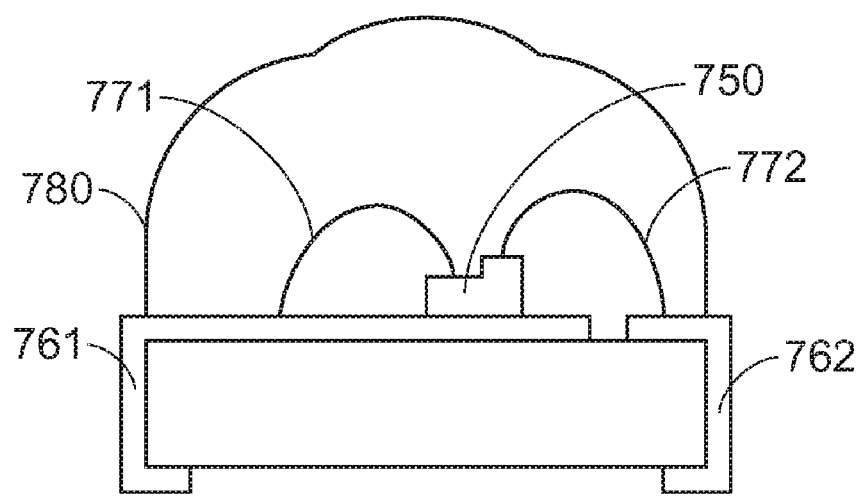

Surface mount device (SMD) is another type of package for the LED chip. Please refer to FIG. 11B, a schematic diagram showing a SMD LED. The package includes two conductive plates 761 and 762 serving as an anode and a cathode. The two electrodes of the LED chip 750 of the present invention are wire-bonded to the two conductive plates 761 and 762 via wires 771 and 772, respectively. The LED chip 750 and the wires 721 and 722 are then wrapped in transparent protective material, epoxy for example. The curvature of the upper portion of the epoxy case 780 can enhance the view angle and control the light-emitting direction of the LED device. Such SMD LED has an advantage of compact size and can have the LED chip 750 well protected.

There are still other known package structures for LED chip. For example, flip-chip type, chip on board type and the like may be applied to the LED chip of the present invention. It is not intended to limit the package type of the LED chip. The exposed portion of the light-emitting region of the LED chip is hence safely encased without being affected by adverse circumstance after the package procedure. The life of the LED chip is thus prolonged.

Figure 12:
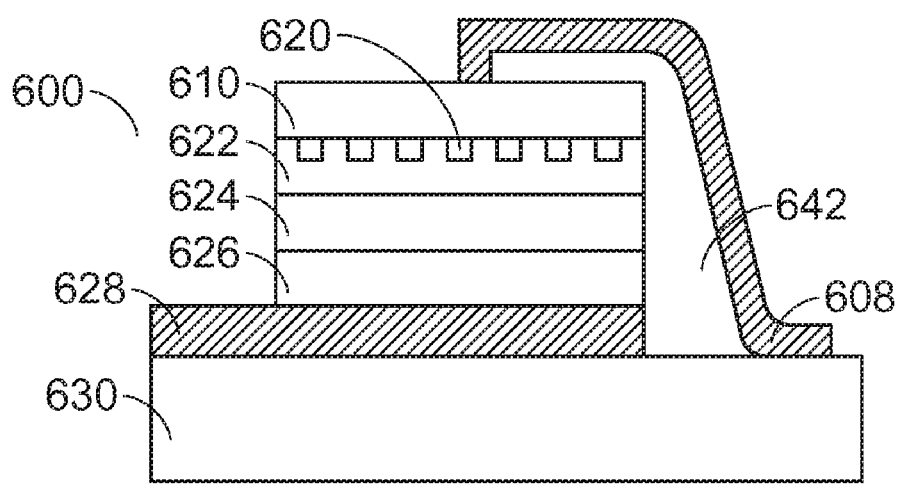
FIG. 12 is a cross-sectional diagram showing a chip-bonding LED according to the second embodiment of the present invention.

FIG. 12 is a cross-sectional diagram showing the structure of the chip-bonding LED chip of the second embodiment of the present invention. The chip-bonding LED chip 600 includes a first electrode 608, a light-emitting region 610, a plurality of ohmic contact dots 620, a reflecting layer 622, a barrier layer 624, a eutectic layer 626, an insulating structure 642, a metal layer 628, and a large-size permanent substrate 630, which is not electrically conductive. In the chip-bonding LED chip 600, the metal layer 628 serves as a second electrode and the insulating structure 642 is made of polyimide. The large-size permanent substrate 630 is a Si substrate, an AlN substrate, a glass substrate, or a quartz substrate.

Figure 13A:
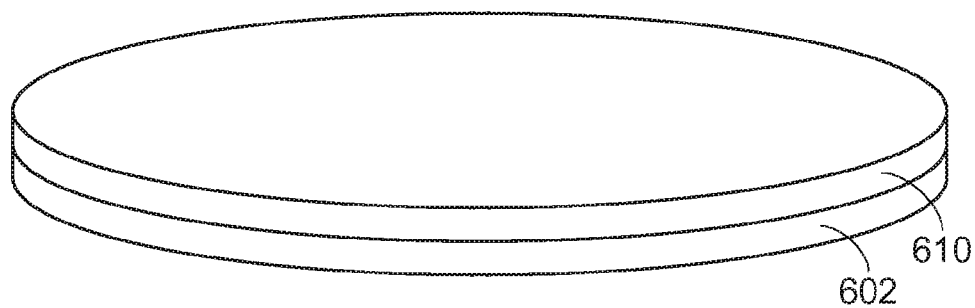

FIGS. 13A to 13G depict the steps of manufacturing the chip-bonding LED chips depicted in FIG. 12 of the second embodiment. In FIG. 13A, an n-doped GaAs temporary substrate 602 is provided and on which a light-emitting region 610 is grown. The light-emitting region 610 at least includes an n-doped AlGaInP layer, an AlGaInP active layer, a p-doped AlGaInP layer, and a p-doped GaP layer arranged in the listed order. Typically, the AlGaInP active layer is a double-heterostructure active layer or a quantum-well active layer. It is understood that the structure of the light-emitting region 610 may vary in configurations according to different requirements. It is intended not to limit the structure of the light-emitting region 610 in the second embodiment of the present invention.

Figure 13B:
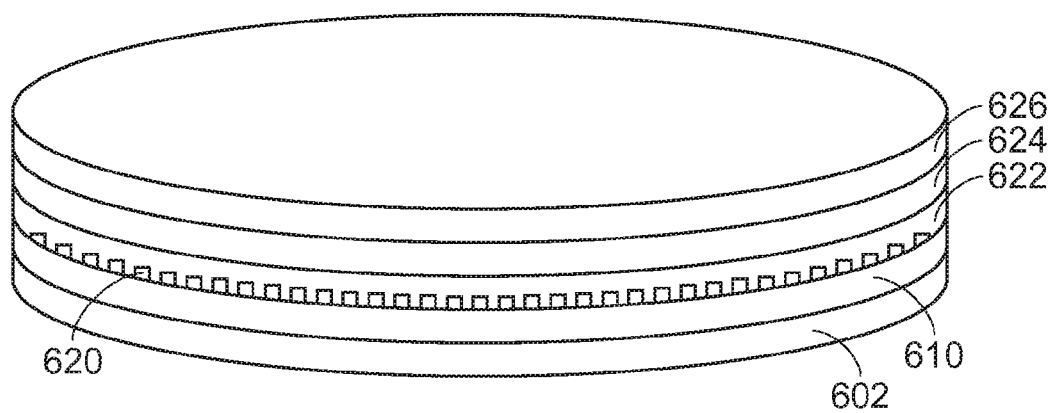

In FIG. 13B, a plurality of ohmic contact dots 620, a reflecting layer 622, a barrier layer 624, and a eutectic layer 626 are sequentially formed on the light-emitting region 610. In the second embodiment of the present invention, the material of the ohmic contact dot 620 is Be/Au or Zn/Au alloy, the reflecting layer 622 is made of a metal having a high reflectivity (e.g., Au, Al or Ag), or a combination of ITO layer (Indium Tin Oxide) and a metal having a high reflectivity. The ITO layer can serve as a reflecting layer due to different refractive indexes of the ITO layer and the light-emitting material. Additionally, the ITO layer can also avoid an inter-diffusion between the metal layer and the light-emitting material, so as to keep the reflectivity of the metal layer. The barrier layer 624 is made of Pt, Ni, W, or ITO having a high stability and a high melting point. The eutectic layer 626 is made of Sn, Sn/Au, Sn/In, Au/In, or Sn/Ag alloy having a melting point around 300° C.

Figure 13C:
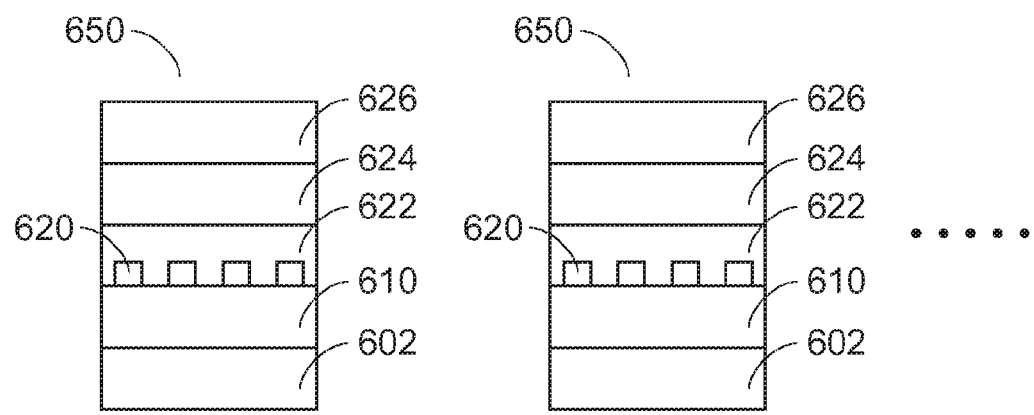

In FIG. 13C, a plurality of dice 650 are manufactured after cutting the above-described structure in FIG. 13B, and each die 650 includes the temporary substrate 602, the light-emitting region 610, a plurality of ohmic contact dots 620, the reflecting layer 622, the barrier layer 624, and the eutectic layer 626.

In FIG. 13D, a large-size permanent substrate 630 is provided, and on which a plurality of metal layers 628 are formed, wherein the surface area of each individual metal layer 628 is greater than the contacted surface of the die 650.

In FIG. 13E, each die 650 is placed on the surface of the metal layer 628, and the eutectic layer 626 of the die 650 is attached with a portion of the metal layer 628, which means the surface area of the metal layer 628 not attached with the die 650 can serve as a second electrode. When all the dice 650 are placed on the surface of the metal layer 628, the eutectic layer 626 of the dice 650 is alloyed to the metal layer 628 utilizing the alloy procedure at a relative low temperature (e.g., below 300° C.).

Figure 13F:
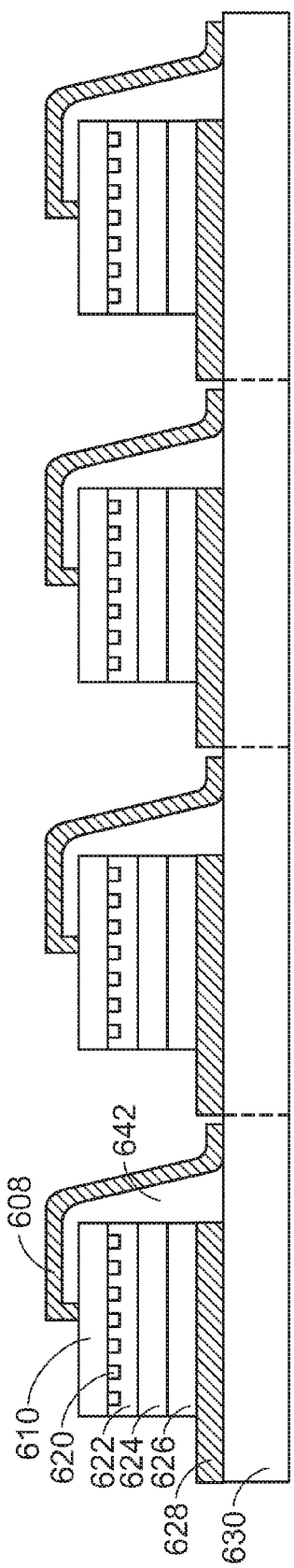

In FIG. 13F, the temporary substrate 602 is removed utilizing a mechanical-polishing procedure or a chemical-etching procedure. An insulating structure 642 is then formed on one side of the die 650. Then a first electrode 608 is formed on the n-doped AlGaInP layer of the light-emitting layer 610, wherein the first electrode 608 covers all the insulating structure 642 and partially covers the permanent substrate 630.

Figure 13G:
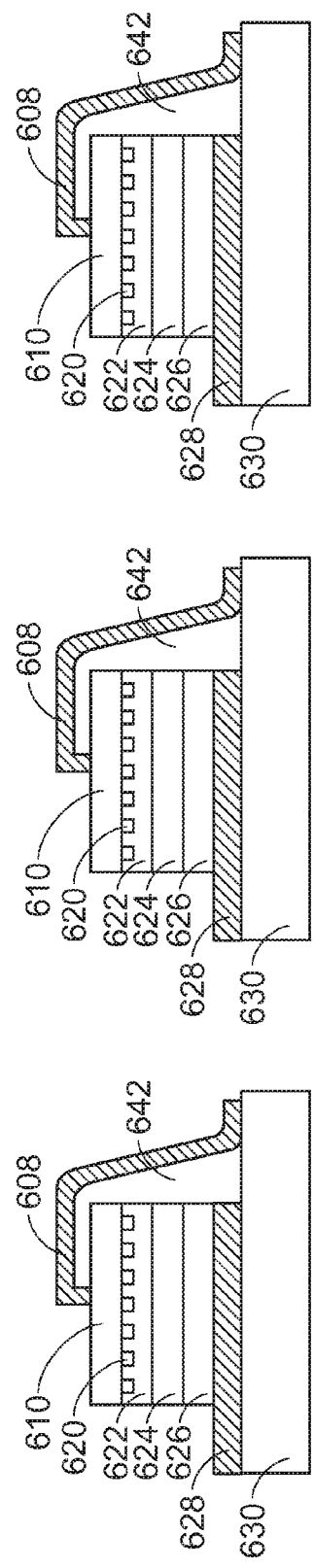

In FIG. 13G, a plurality of chip-bonding LED chips are manufactured after cutting the permanent substrate 630 of the structure depicted in FIG. 13F, wherein the surface area of the permanent substrate 630 is greater than the cross-sectional area of the die 650.

In the second embodiment of the present invention, the first metal layer 628 is served as a second electrode because the metal layer 628 is alloyed to the eutectic layer 626. Additionally, because the first electrode 608 covers the permanent substrate 630 and both the first metal layer 628 (second electrode) and the first electrode 608 are partially or entirely exposed, the bonding wires can be directly bonded to the first metal layer 628 (second electrode) and the first electrode 608 without damaging the chip.

Moreover, the alloy procedure is processed prior to the removal of the temporary substrate 602, so as the light-emitting region 610 in chip can be relatively thin (e.g., 10 μm~30 μm), and the cost of the EPI process can be down. Moreover, the wafer broken occurring in the alloy procedure can be avoided because the wafer is cut into dice 650 first, and then placed on the metal layer 628, so as the yield of the LED chips is almost 100%. In addition, the alloy procedure between the die 650 and the substrate 630 of the second embodiment of the present invention can be processed at a relatively low temperature without degrading the performance of the chips. The alloy temperature is under temperature 300° C. if the eutectic layer is made of Sn/Au having ratio of 20/80 (Sn20Au80).

As shown in FIG. 13G, a portion of the surface of the light-emitting region 610 is exposed to the atmosphere. The exposed portion of the light-emitting region may be damaged due to improper contact or oxidation. Hence, the manufactured LED chip should be packaged to prevent from such damage affecting the emitting efficiency as described in the previous description. The common package includes lamp-type, SMD type, flip-chip type, chip on board type.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A LED chip, comprising:
a permanent substrate having a holding space on top of the permanent substrate;
an insulating layer on top of the permanent substrate and covering the holding space;
a first metal layer on top of the insulating layer;
a second metal layer on top the insulating layer;
a die comprising a eutectic layer and a light-emitting region, wherein the light-emitting region is on top of the eutectic layer, and the die is bonded to the first metal layer within the holding space via the eutectic layer coupling to the first metal layer;
a filler structure filled between the die and the holding space; and
a first electrode on top of the die, in contact with the light-emitting region and above the filler structure, and above and contacting the second metal layer, and the first electrode extending to outside of the holding space;
wherein a portion of a surface of the light-emitting region is exposed from the filler structure and the first electrode, and the second metal layer is formed between the first electrode and the insulating layer.

2. The LED chip according to claim 1, wherein the permanent substrate is a Si substrate, an AlN substrate, a glass substrate, or a quartz substrate.

3. The LED chip according to claim 1, wherein a plurality of ohmic contact dots, a reflecting layer, a barrier layer are formed between the light-emitting region and the eutectic layer.

4. The LED chip according to claim 3, wherein the material of the ohmic contact dots includes a Be/Au or Zn/Au alloy; the reflecting layer is made of Au, Al, Ag, or a combination of Indium Tin Oxide and a metal having a high reflectivity; the barrier layer is made of Pt, Ni, W, or Indium Tin Oxide; or the eutectic layer is made of a Sn/Au alloy or a Sn/Ag alloy.

5. The LED chip according to claim 1, wherein the light-emitting region further comprises:
an n-doped AlGaInP layer;
an AlGaInP active layer grown on the n-doped AlGaInP layer;
a p-doped AlGaInP layer grown on the AlGaInP active layer; and
a p-doped GaP layer grown on the p-doped AlGaInP layer.

6. The LED chip according to claim 5, wherein the AlGaInP active layer is a double-hetero structure active layer or a quantum-well active layer and the thickness of the light-emitting region is between 10 μm-30 μm.

7. The LED chip according to claim 1, wherein the material of the filler structure is polyimide, and a bottom area of the holding space is equal, or greater, than the cross-sectional area of the die.

8. The LED chip according to claim 1, wherein the second metal layer is not coupled to the first metal layer.

9. The LED chip according to claim 1, wherein the LED chip is to be packaged to have the light-emitting region of the die be covered with protective material.

10. A LED chip, comprising:
a permanent substrate having a holding space on top of the permanent substrate;
an insulating layer, on top of the permanent substrate covering, including a first insulating layer section covering the holding space and a second insulating layer section covering the permanent substrate outside of the holding space, wherein the first insulating layer section is connected with the second insulating layer section;
a first metal layer on top of the insulating layer;
a die comprising a eutectic layer and a light-emitting region, wherein the light-emitting region is on top of the eutectic layer, and the die is bonded to the first metal layer within the holding space via the eutectic layer coupling to the first metal layer;
a filler structure filled between the die and the holding space; and
a first electrode on top of the die, in contact with the light-emitting region, and the first electrode horizontally extending to directly above the second insulating layer section and to outside the holding space;
wherein the first electrode is not in contact with the first metal layer; and
wherein a portion of a surface of the light-emitting region is exposed from the filler structure and the first electrode.

* * * * *